(12) United States Patent
Lin

(10) Patent No.: US 8,514,317 B2
(45) Date of Patent: Aug. 20, 2013

(54) COMPACT CAMERA MODULE

(75) Inventor: Ming-Yuan Lin, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 365 days.

(21) Appl. No.: 12/762,331

(22) Filed: Apr. 17, 2010

(65) Prior Publication Data

US 2010/0201863 A1 Aug. 12, 2010
US 2012/0268644 A9 Oct. 25, 2012

Related U.S. Application Data

(62) Division of application No. 11/935,366, filed on Nov. 5, 2007, now Pat. No. 7,782,390.

(51) Int. Cl.
*H04N 5/225* (2006.01)

(52) U.S. Cl.
USPC ............................ 348/340; 348/374; 257/433

(58) Field of Classification Search
USPC .................... 348/340, 374; 257/433; 438/64
See application file for complete search history.

(56) References Cited

U.S. PATENT DOCUMENTS

| | | | |
|---|---|---|---|
| 6,900,843 B1 * | 5/2005 | Uchiyama | 348/374 |
| 2002/0044215 A1 * | 4/2002 | Takagi et al. | 348/374 |
| 2002/0167605 A1 * | 11/2002 | Akimoto et al. | 348/374 |
| 2004/0017501 A1 * | 1/2004 | Asaga et al. | 348/340 |
| 2006/0221225 A1 * | 10/2006 | Tsukamoto et al. | 348/340 |
| 2006/0290802 A1 * | 12/2006 | Webster et al. | 348/340 |
| 2007/0236596 A1 * | 10/2007 | Sekine et al. | 348/340 |
| 2009/0033789 A1 * | 2/2009 | Lin | 348/374 |
| 2009/0262226 A1 * | 10/2009 | Lee et al. | 348/294 |

* cited by examiner

*Primary Examiner* — Sinh Tran
*Assistant Examiner* — Paul Berardesca
(74) *Attorney, Agent, or Firm* — Altis Law Group, Inc.

(57) ABSTRACT

A camera module includes a lens holder, a lens module, an image sensor chip, and a printed circuit board. The lens module is received in the lens holder. The lens module includes a lens barrel and at least one lens received in the lens barrel. The image sensor chip has a photosensitive area configured for receiving light transmitted through the lens module. The printed circuit board defines a top surface for receiving both the image sensor chip and the lens barrel thereon and an opposite bottom surface thereon. The bottom surface defines a plurality of recesses thereon for receiving the corresponding electronic elements therein by adhesives.

3 Claims, 5 Drawing Sheets

COMPACT CAMERA MODULE

CROSS-REFERENCE TO RELATED APPLICATIONS

This application is a divisional application of prior U.S. patent application Ser. No 11/935,366 filed on Nov. 5, 2007 now U.S. Pat. No. 7,782,390, which in turn is based on and claims priority from China Patent Application No. 200710201269.6 filed on Aug 3, 2007. The entire contents of the related China Patent Application are incorporated herein by reference.

BACKGROUND

1. Technical Field

The present disclosure relates to the art of camera modules and, particularly, to a camera module with small-sized image sensor chip package used in portable electronic devices.

2. Description of Related Art

High-end portable electronic devices, such as mobile phones and personal digital assistants (PDAs), are being developed to be increasingly multi-functional. Many of these portable electronic devices are popularly equipped with digital cameras. To facilitate portability, such portable electronic devices tend to be compact, slim, and light. Accordingly, digital cameras incorporated in the portable electronic devices must also be compact, slim, and light, yet remain cost-effective.

Referring to FIG. 5, a typical digital camera module 1 includes a lens module 2, a lens holder 3, and an image sensor chip 4. The lens module 2 includes a barrel 21 and a lens 22 received in the barrel 21. The barrel 21 is partially received in and is threadedly engaged with the lens holder 3. An infra-red (IR) cut filter 6 is adhered to a top surface 40 of the image sensor chip 4 to protect the image sensor chip 4 against damage from IR light. The image sensor chip 4 is typically mounted on a printed circuit board 5. The image sensor chip 4 has a photosensitive area 41 formed on the top surface 40 thereof. The photosensitive area 41 is configured for receiving light signals transmitted through the lens module 2. A plurality of chip pads is formed on the top surface 40 surrounding the photosensitive area 41. A plurality of board pads is formed on the printed circuit board 5 to electrically connect to the corresponding chip pads via wires. A plurality of elements 7 is formed on the periphery of the printed circuit board 5 around the board pads. The lens holder 3 is mounted on the printed circuit board 5 so that the image sensor chip 4, the chip pads, the board pads, and the wires are received therein.

In the camera module 1, the printed circuit board 5 needs to provide sufficient space not only for the image sensor chip 4, the driver 7, and the wires, but also for the lens holder 3 as well. To minimize the size and volume of the camera module 1 to a certain degree, an end portion 32 of the lens holder 3 is made thin. However, such a thin lens holder 3 is not easily manufactured by an injection molding method. This difficulty results in a relatively high cost. As such, the camera module 1 has not proven to be economically suitable for slim and compact electronic products.

What is needed, therefore, is a camera module that is both compact and economical to produce.

BRIEF DESCRIPTION OF THE DRAWINGS

Many aspects of the present camera module can be better understood with reference to the following drawings. The components in the drawings are not necessarily drawn to scale, the emphasis instead being placed upon clearly illustrating the principles of the camera module. Moreover, in the drawings, like reference numerals designate corresponding parts throughout the several views.

DETAILED DESCRIPTION

Embodiments of the present camera module will now be described in detail below with reference to the drawings.

Figure 1:
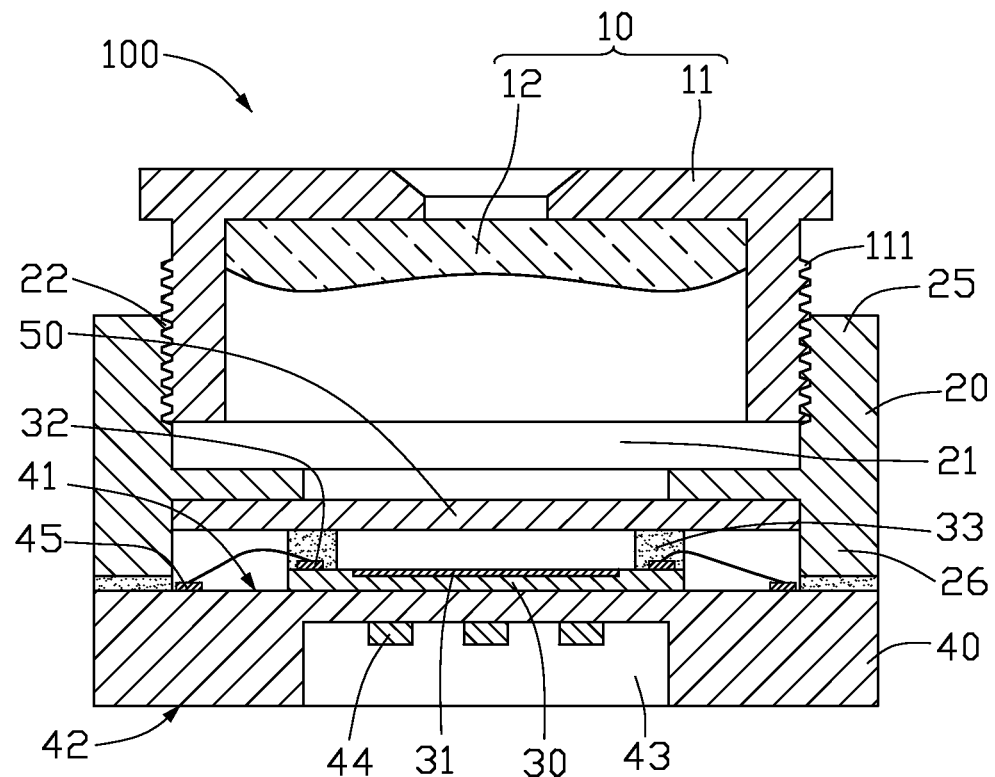
FIG. 1 is a schematic, cross-sectional view of a camera module in accordance with a first embodiment.

Referring to FIG. 1, a camera module 100, in accordance with a first embodiment, includes a lens module 10, a lens holder 20, an image sensor chip 30, and a printed circuit board (PCB) 40. The lens module 10 is partially received in the lens holder 20. The image sensor chip 30 is fixed to the lens holder 20.

The lens module 10 includes a lens barrel 11 and at least one lens 12. The lens barrel 11 is configured for receiving the at least one lens 12 therein, and has an external thread 111 formed thereon. In other embodiments, the at least one lens 12 could include two or more lenses received in the lens barrel 11.

The lens holder 20 has a front end 25 and a rear end 26, opposite to the front end 25, and defines a receiving cavity 21 penetrating/extending through the lens holder 20 from the front end 25 to the rear end 26. An internal thread 22 is formed on part of an inner surface of the lens holder 20, beginning at or adjacent to the front end 25. The lens barrel 11 is partially received in the lens holder 20 by engaging the external thread 111 of the lens barrel 11 with the internal thread 22 of the lens holder 20.

The image sensor chip 30 is disposed directly on the PCB 40. The image sensor chip 30 has a first surface facing towards the lens module 10 and a second surface opposite to the first surface. The image sensor chip 30 has a photosensitive area 31 configured (i.e., structured and arranged) for receiving light transmitted through the lens module 10. A plurality of chip pads 32 is formed on the first surface surrounding the photosensitive area 31. An adhesive 33 is applied in patches between the photosensitive area 31 and the chip pads 32 or applied as a continuous layer surrounding the photosensitive area 31 and covering the chip pads 32. In this embodiment, the adhesive 33 is applied surrounding the photosensitive area 31 and covering the chip pads 32. The adhesive 33 can be made of a curable adhesive material, for example, a silicone, epoxy, acrylic, or polyamide adhesive.

A transparent layer 50 is adhered to the first surface of the image sensor chip 30 via the adhesive 33. The transparent layer 50 and the adhesive 33 cooperatively form a package structure for the photosensitive area 31.

The PCB 40 includes a top surface 41 and a bottom surface 42 opposite to the top surface 41. The image sensor chip 30 is adhered to the middle portion of the top surface 41. A plurality of board pads 45 is formed directly on the top surface 41 surrounding the image sensor chip 30. Each board pad 45 is electrically connected to the corresponding chip pad 32 via a respective wire. The wires in this embodiment are made of a highly conductive, oxidation-resistant material, such as gold, aluminum, or an alloy thereof. A first recess 43 is formed in the middle of the bottom surface 42 and is provided for adhering at least one electronic element 44 on a bottom portion of the first recess 43. The electronic element 44 can be a passive or active element. The electronic element 44 is electrically connected to the PCB 40. In order to prevent dust or vapor entering the first recess 43 and affecting the performance of the electronic element 44, glue can be used to cover the first recess 43 to protect the electronic element 44.

Figure 2:
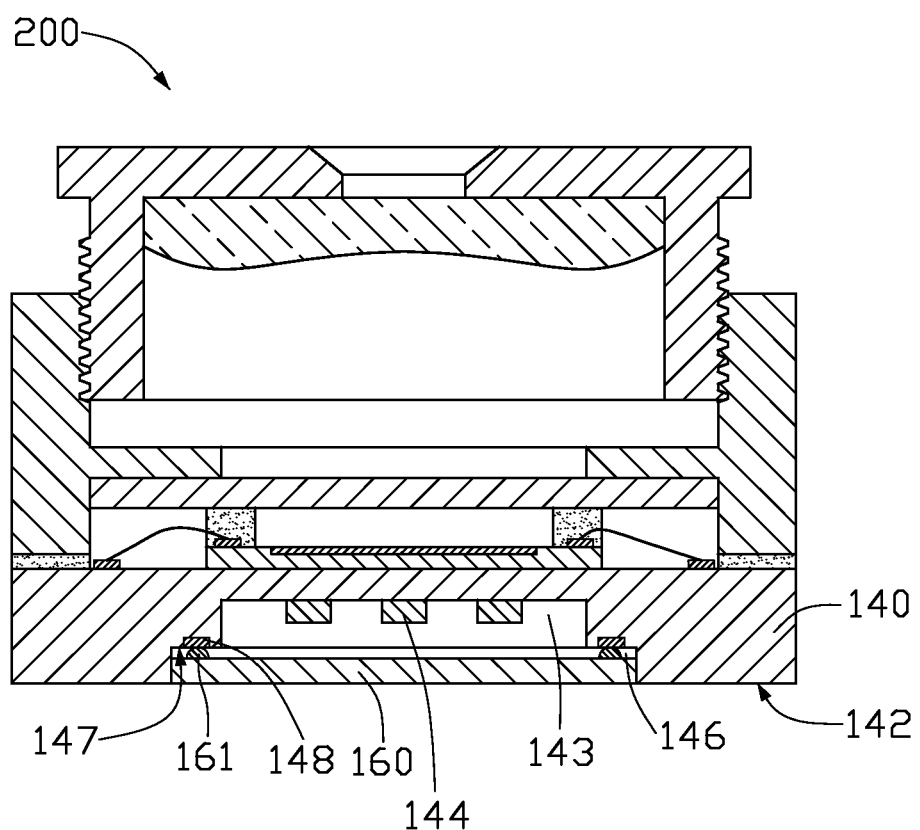
FIG. 2 is a schematic, cross-sectional view of a camera module in accordance with a second embodiment.

Referring to FIG. 2, a camera module 200, in accordance with a second embodiment, is similar to the camera module 100 of the first embodiment. In this second embodiment, the bottom surface 142 of the PCB 140 defines a step-shaped recess in the middle thereof. The step-shaped recess comprises a first recess 143 formed on an upper portion thereof and a second recess 146 coaxially formed on a lower portion thereof. The diameter of the second recess 146 is greater than that of the first recess 143 to form a middle surface 147 between the first recess 143 and the second recess 146. At least one zero voltage point 148 is formed on the middle surface 147 thereof for adjusting the voltage of the conductors connected to the at least one zero voltage point 148 to zero. A cover plate 160 made from electrical material and received in the second recess 146 defines at least one electronic layer received therein and at least one external point 161 formed on a surface nearest the first recess 143. In this embodiment, the at least one zero voltage point 148 is four zero voltage points 148, and they are respectively positioned on corners of the middle surface 147. The number of external points 161 is equal to that of the zero voltage points 148. The at least one electronic layer of the cover plate 160 is electrically connected to the zero voltage points 148 by the external points 161, and thereby the cover plate 160 can prevent electromagnetic waves generated by the electronic elements 144 received in the first recess 143 from affecting the image sensor chip 130. Other configurations of the second embodiment are the same as that of the first embodiment, and so are not described in detail.

Alternatively, the zero voltage points 148 may be omitted, and so are the external points 161 formed on the bottom surface 142 of the PCB 140, thereby the cover plate 160 is directly adhered to the middle surface 147. During assembly of the camera module 200 to a main printed board (not shown), the external points 161 of the cover plate 160 are electrically connected to the main printed board to prevent electromagnetic waves generated by the electrical elements 144 received in the first recess 143 from affecting the image sensor chip 130 of the camera module 200.

Figure 3:
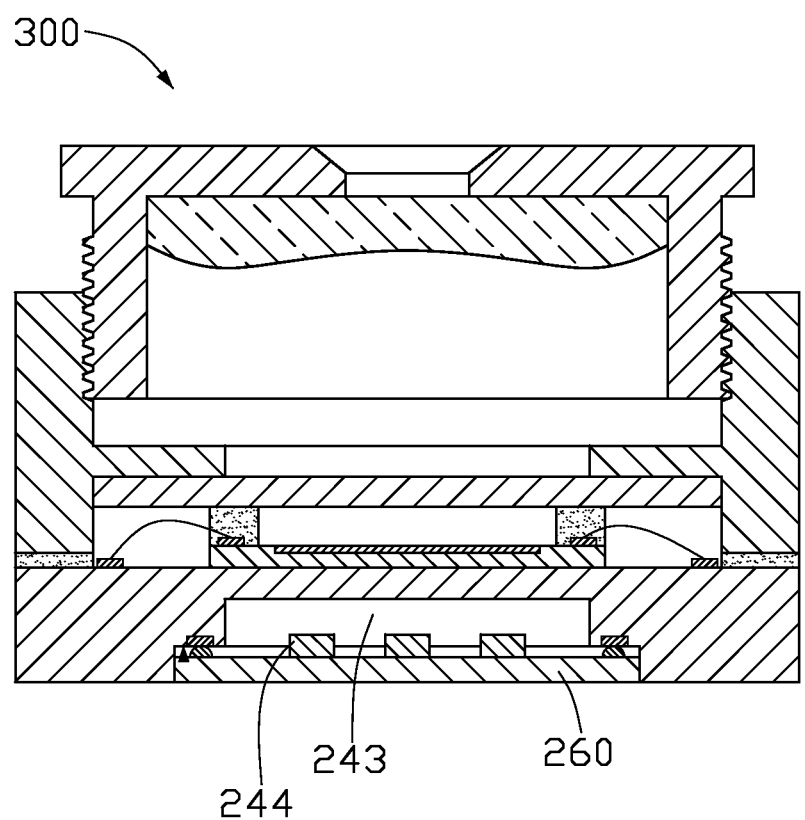
FIG. 3 is a schematic, cross-sectional view of a camera module in accordance with a third embodiment.

Referring to FIG. 3, a camera module 300, in accordance with a third embodiment, is similar to the camera module 200 of the second embodiment. In this embodiment, the electrical element 244 is directly adhered to the cover plate 260, not in the bottom of the first recess 243. Other configurations of the third embodiment are the same as that of the second embodiment, and so are not described in detail.

Figure 4:
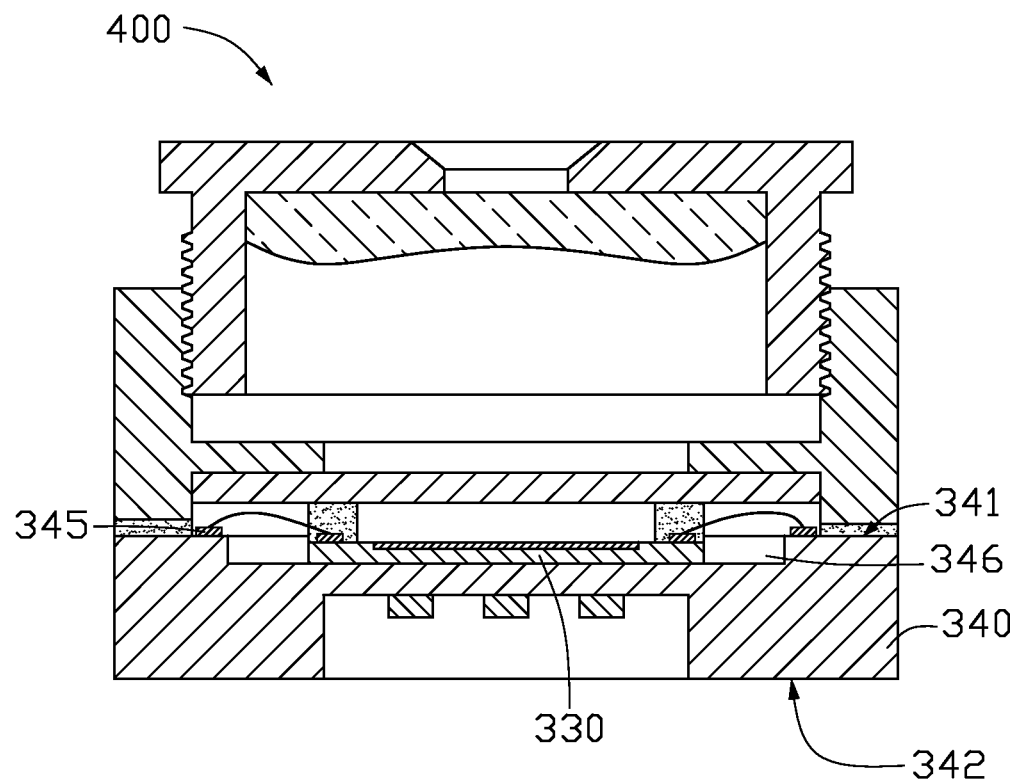
FIG. 4 is a schematic, cross-sectional view of a camera module in accordance with a fourth embodiment.
Figure 5:
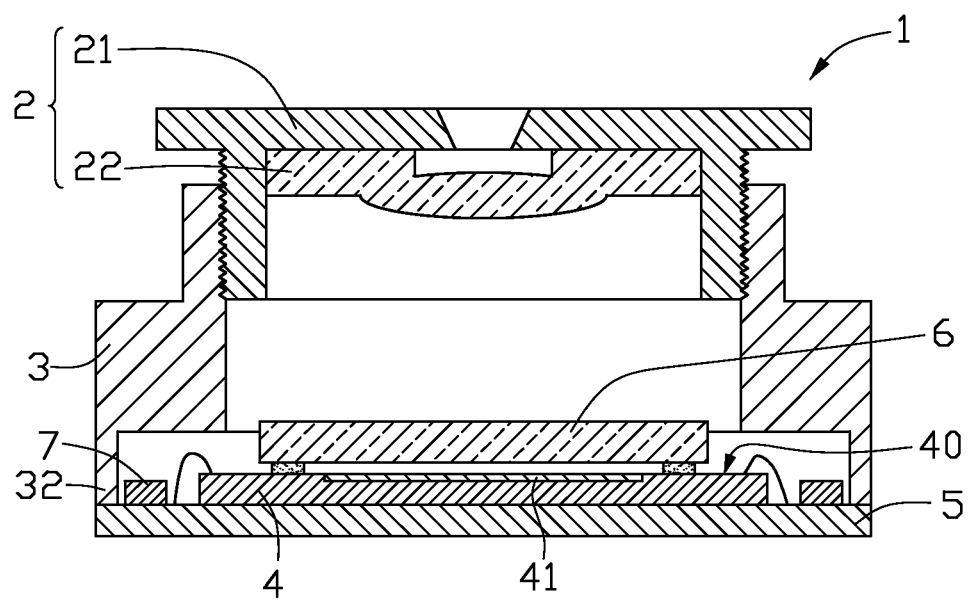
FIG. 5 is a schematic, cross-sectional view of a typical related camera module.

Referring to FIG. 4, a camera module 400, in accordance with a fourth embodiment, is similar to the camera module 100 of the first embodiment. In this embodiment, the second recess 346 is formed in the middle of the top surface 341, not in the bottom surface 342 of the PCB 340. The image sensor chip 330 is received in the second recess 346, and the board pad 345 is formed on an exposed portion of the top surface 341 surrounding the second recess 346. Other configurations of the fourth embodiment are the same as that of the first embodiment, and so are not described in detail.

In the camera modules, the electronic elements are adhered in the first recess formed on the bottom surface, not positioned on the top surface of the PCB. Therefore, special space is not needed adjacent the PCB for positioning of the electronic elements thereon. Thus, the problematic thin walls of the related art can be replaced by more conveniently formed and stronger walls, or the space freed up could be used so that less precision in placement of elements is required, due to greater space availability for such, which could reduce manufacturing costs, or the camera modules could be made having a smaller diameter allowing for smaller electronic devices utilizing same.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A camera module comprising:
    a lens holder defining a receiving portion thereof;
    a lens module partially received in the receiving portion of the lens holder, the lens module comprising a lens barrel movably engaged in the lens holder and at least one lens received in the lens barrel; and
    an image sensor chip package mounted to the lens holder, comprising:
        a circuit board defining a top portion formed thereof, a bottom portion opposite to the top portion, and a plurality of board pads arranged on the top portion;
        an image sensor chip mounted on the top portion of the circuit board, the image sensor chip comprising a photosensitive area configured for receiving light transmitted through the lens module, and a plurality of chip pads formed surrounding the photosensitive area;
        a plurality of wires each electrically connecting one of the plurality of chip pads of the image sensor chip with a corresponding one of the plurality of board pads of the circuit board;
        an adhesive means applied surrounding the photosensitive area and covering the plurality of chip pads;
        a transparent layer mounted to the image sensor chip via the adhesive means, the transparent layer together with the adhesive means sealing the photosensitive area of the image sensor chip; and
        a cover plate;
    wherein the lens holder is adhered to the top portion of the circuit board, the bottom portion of the circuit board defines at least one recess for receiving at least one electronic element therein, the at least one electronic element electrically connected to the circuit board;
    the at least one recess comprises a step-shaped configuration with a first recess formed on an upper portion thereof and a second recess coaxially formed on a lower portion thereof;
    the cover plate is received in the second recess and covers the first recess;
    the camera module further comprises at least one electronic element adhered to an upper portion of the cover plate; and
    the diameter of the second recess is greater than that of the first recess to form a middle surface between the first recess and the second recess, a plurality of zero voltage points is formed on the periphery of the middle surface thereof for adjusting the voltage of conductors connected to the plurality of zero voltage points to zero, and a plurality of external points is formed on the periphery of the cover plate surrounding the at least one electronic element of the cover plate to electrically connect to corresponding ones of the plurality of zero voltage points.

2. The camera module as claimed in claim 1, wherein the cover plate is made from electrical conductive material.

3. The camera module as claimed in claim 1, wherein the lens holder has an internal thread formed on an inner surface, the lens barrel has an external thread corresponding to and screwing with the internal thread of the lens holder, and the external thread is formed on an external surface of the lens barrel.

* * * * *